United States Patent [19]

Firester et al.

[11] Patent Number: 4,543,171
[45] Date of Patent: Sep. 24, 1985

[54] METHOD FOR ELIMINATING DEFECTS IN A PHOTODETECTOR

[75] Inventors: Arthur H. Firester, Montgomery Township, Somerset County; Robert V. D'Aiello, East Brunswick Township, Middlesex County, both of N.J.

[73] Assignee: RCA Corporation, Princeton, N.J.

[21] Appl. No.: 592,396

[22] Filed: Mar. 22, 1984

[51] Int. Cl.[4] .................... C25F 3/12; H01L 21/308
[52] U.S. Cl. .................... 204/129.3; 156/643; 156/646; 156/657
[58] Field of Search .............. 204/192 E, 129.3, 129.1; 156/643, 646, 655–657

[56] References Cited

U.S. PATENT DOCUMENTS

| | | | |
|---|---|---|---|
| 4,064,521 | 12/1977 | Carlson | 357/2 |
| 4,094,733 | 6/1978 | Gallagher | 204/129.1 X |
| 4,166,918 | 9/1979 | Nostrand et al. | 136/89 R |
| 4,385,971 | 5/1983 | Swartz | 204/129.1 |
| 4,436,581 | 3/1984 | Okudaira et al. | 204/192 E X |
| 4,464,823 | 8/1984 | Izu et al. | 204/129.3 X |

*Primary Examiner*—Donald R. Valentine
*Attorney, Agent, or Firm*—Birgit E. Morris; Donald S. Cohen; William J. Burke

[57] ABSTRACT

The performance of a photodetector is reduced by the presence of an electrical defect such as a short or a shunt. The invention is a method of improving the performance of this photodetector by preferentially removing a portion of an exposed surface of a detector electrode at the defect site. The preferential etching of the exposed surface is obtained by immersing the photodetector in a chemical etching ambient which has an etching rate for the exposed surface of the electrode which increases with increasing temperature while applying a reverse-bias voltage to the electrodes. The reverse-bias voltage has sufficient magnitude to cause a local increase in temperature of the exposed surface at the defect site.

10 Claims, 1 Drawing Figure

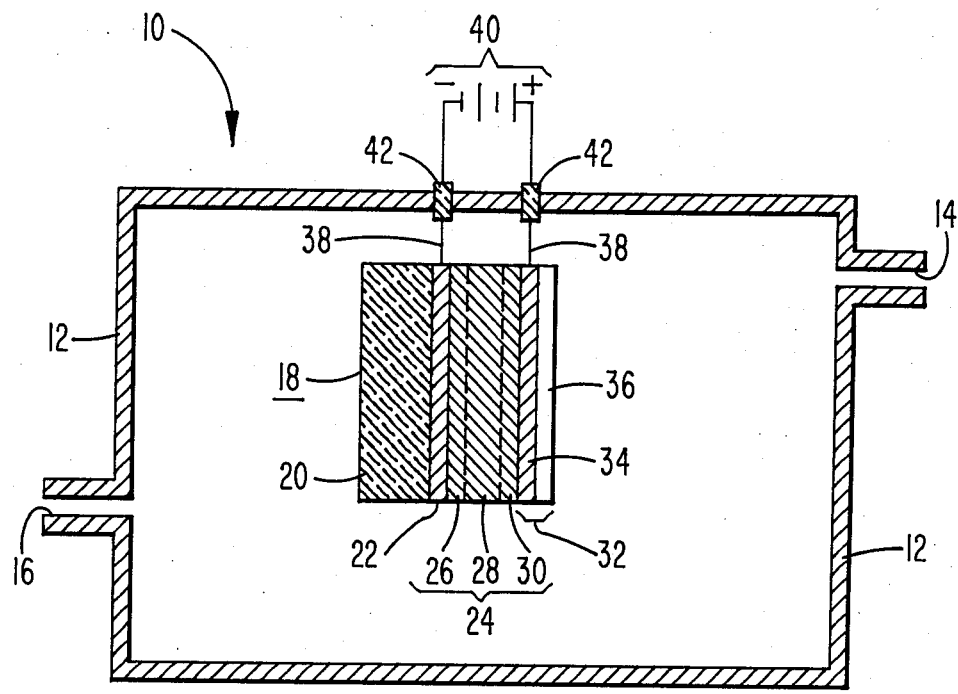

METHOD FOR ELIMINATING DEFECTS IN A PHOTODETECTOR

The invention relates to a method for removing defects, specifically electrical shorts and shunts formed during the fabrication process, in a large-area photodetector.

BACKGROUND OF THE INVENTION

Photocurrents and photovoltages produced by a photodetector, composed for example of amorphous silicon, as disclosed in U.S. Pat. No. 4,064,521, incorporated herein by reference, can be significantly reduced by electrical shorts or shunts formed during the fabrication of the detector. Electrical shorts occur either when there is an opening in the semiconductor material which causes the front and back electrodes to contact one another or if there is a conductive metal path extending through the semiconductor material. A shunt is the loss of charge in the semiconductor material due either to an imperfect rectifying barrier or to the formation of an ohmic contact via a high-work function metal rather than a Schottky rectifying barrier. The probability of the occurrence of a defect will increase rapidly with increasing detector area.

In order to economically fabricate large-area photodetectors, methods must be developed to either eliminate such shorts or shunts during fabrication or after fabrication. Elimination of defects during fabrication requires facilities and processing conditions which will greatly increase the cost of the photodetector. For this reason it is desirable to develop methods for the removal of such defects after the fabrication of the detector has been completed.

The process for removal of a defect in a photodetector comprising a material such as gallium arsenide, cadmium telluride, single-crystal or amorphous silicon, requires the etching out of the defect. Attempts made to remove the defects by the application of a reverse-bias voltage have tended in the past to increase the incidence of shorts and shunts in the photodetector. Nostrand et al in U.S. Pat. No. 4,166,918 have disclosed that defects in the solar cell containing a cermet layer between the active region and the exposed electrode can be reduced by applying a reverse-bias voltage to the cell which is sufficient to burn out electrical shorts and shunts but less than the breakdown voltage of the photodetector. This approach is useful for a defect of intermediate size but fails for small and very large defects where the heat generated is either too small or spread over too large an area to burn out the defect. Swartz in U.S. Pat. No. 4,385,971 has disclosed that defects in a solar cell can be electrochemically eliminated by connecting the device as one electrode to one polarity and a second separate electrode to the opposite polarity of a dc power supply and immersing these electrodes in an anodizing chemical etching electrolyte. Application of a reverse-bias voltage between the electrodes causes either electrochemical etching or mechanical removal of the defects. Other techniques for the removal of defects have included placing a cell having such defects under a reverse-bias voltage and locating defects using either thermally sensitive liquid-crystal techniques or infrared-imaging techniques. After the defect is located, the bias is removed and an etchant is locally applied to the exposed electrode of the cell thereby removing the electrode locally and eliminating the electrical contact to the defect. This approach has the undesirable feature that the etching process is not locally selective and, as a result, an unnecessarily large portion of the exposed electrode is removed due to the finite size of the acid droplet and the operator's inability to determine when the etching process has proceeded far enough to eliminate the defect.

SUMMARY OF THE INVENTION

The invention is a method for removing electrical defects in a photodetector having a pair of electrodes on a semiconductor body. The method comprises the step of placing the photodetector in an etching chemical ambient with a reverse-bias voltage applied between the electrodes. The chemical ambient has an etch rate for the material of at least one of the electrodes which increases with increasing temperature. Heat generated by electrical current flow through a defect causes a preferential local etching of the exposed surface of the electrode at the defect. Preferably the etching ambient is a gaseous material such as hydrochloric acid or fluorine which results in a volatile compound which does not remain on the photodetector surface thereby retarding further etching at the defect site.

BRIEF DESCRIPTION OF THE DRAWING

The sole FIGURE is a cross-sectional view of an etching enclosure containing a photodetector under reverse bias in a chemical etching ambient.

DETAILED DESCRIPTION OF PREFERRED EMBODIMENTS

The apparatus used for practicing the invention, as shown in the FIGURE, includes an etching ambient enclosure 10 for containing the etching ambient comprising walls 12 with an etching ambient intake port 14 and an exhaust port 16 extending therethrough and having mounted therein a photodetector 18. The detector 18 includes a substrate 20, a first electrode 22 overlying a surface of the substrate 20, a semiconductor body 24, comprising a P-type region 26, an intrinsic-type region 28 and an N-type region 30, overlying the first electrode 22 and a second electrode 32 overlying the semiconductor body 24. The second electrode 32 includes an electrical contact layer 34 and a passivation layer 36. Electrical wires 38 connect the electrodes 22 and 32 to a reverse-bias voltage supply 40 via electrical feedthroughs 42.

The etching ambient enclosure is composed of a material such as polypropylene or glass which is resistant to attack by the etching ambient. If the etching ambient is gaseous, the enclosure is made air-tight. For a liquid ambient the enclosure can be open or vented. The intake port 14 is connected to a source, not shown, of the etching ambient in the form of gas or liquid storage vessels. The exhaust port 16 may be connected to a gas scrubber or waste disposal vessel through an exhaust pump, not shown. Alternatively the exhaust system may be a recirculating one with provision for removal of the etching byproducts.

The photodetector 18 may be composed of a single cell or a plurality of cells connected in a series or parallel arrangement with the appropriate interelectrode connections. The substrate 20 may be composed of an electrically insulating material such as glass or an electrical conductor such as stainless steel in which case the first electrode 22 may be eliminated. The first electrode 22 may be composed of a light-transmissive conductive oxide or a metallic material deposited and defined using well-known techniques. The semiconductor body 24 may be composed of one or more light-sensitive materials having a semiconductor junction. The semiconductor junction may be a P-I-N or P-N junction in the body or a Schottky barrier at one of the electrodes. Typically the body 24 consists of layer of hydrogenated amorphous silicon deposited from a glow discharge in a monosilane together with appropriate dopant gases as disclosed by Carlson in U.S. Pat. No. 4,064,521. The electrical contact layer 34 may be composed of one or more metal layers or a light-transmissive conductive oxide. Typically the layer 34 is composed of a titanium layer about 5 nanometers (nm) thick and an aluminum layer about 500 nm thick. The overlying passivating layer 36, if present, may be composed of an inorganic material, such as $SiO_2$, or an organic resin which has the requisite passivation properties as well as suitable etching properties as discussed below.

The application of a reverse-bias voltage of greater than about one volt but less than the breakdown voltage to an individual photodetector cell, such as that described above, which has an electrical defect, causes an electrical current to flow between the electrodes through the defect. This current flow causes a local 30°–50° C. temperature increase of the second electrode composed only of metal layers. Preferably the temperature increase is at least 20° C. in order to provide a sufficient differential etch rate.

In this connection we have found that the presence of a barrier layer, such as the thin titanium layer, is important to prevent further damage to the cell under reverse-bias conditions. In particular, a second electrode composed only of aluminum will alloy with the amorphous silicon in the heated areas. A second electrode composed only of silver will spike through the amorphous silicon, forming a permanent short. In either case the cell is rendered useless. The titanium layer serves as a barrier to such interactions, thereby permitting the use of the reverse-bias voltage with commonly used electrode materials.

The etching chemical ambient is a material composition which will preferentially remove the material at the exposed surface of the second electrode by chemical combination of the material with the chemical ambient at a rate which increases substantially with increasing temperature. The local increase of temperature at a defect site in a cell under reverse bias provides the differential etch rate which preferentially removes the exposed material of the second electrode. Removal of the electrode at the defect in effect eliminates the influence of the defect on cell performance because of the high lateral resistance of the semiconductor material.

Preferably the ambient is a gaseous composition, such as hydrochloric acid or fluorine, whose reaction with the electrode produces a volatile compound which does not remain on the surface and retard further etching at the defect site. Alternatively the etching ambient may be a liquid such as the composition 15 $HPO_3$:3 $HNO_3$:2 $CH_3CO_2H$:1 $H_2O$ diluted to one part in three parts water. This composition is a known etch for aluminum which we have found to exhibit a marked increase in etch rate with a local increase in the temperature at a defect site.

The method of the invention has the advantage that the removal of a defect is a self-limiting process in that, once the electrical contact to the defect in the semiconductor material has been removed, electrical current will cease flowing through the defect. The local temperature will then return to the ambient temperature thereby greatly reducing the etch rate. To obtain the maximum non-linearity in the local etch rate, it may be desirable to cool the etching ambient and, preferably, the panel to a temperature less than 20° C., room temperature.

The second electrode 32 of the solar cell panel of the FIGURE is shown to include the passivation layer overlying the electrical contact layer 34. The method of the invention also includes the procedure in which a first chemical etching ambient preferentially etches only the passivation layer leaving the underlying contact layer 34 untouched. The contact layer 34 is then locally removed in a second etchant ambient using the passivation layer with the openings therein as an etch mask for this step. Alternatively the first chemical etching ambient may remove both the passivation and contact layers at the defect site with the passivation layer 36 providing the desirable feature that any interaction of the etching ambient with the metal portion of the contact layer 34 is prevented.

We claim:

1. A method for improving the performance of a photodetector having an electrical defect therein and comprising a pair of electrodes on a semiconductor body, said method comprising the step of immersing said photodetector in a chemical ambient having an etching rate for an exposed surface of at least one of said electrodes which increases with increasing temperature while applying a reverse-bias voltage of sufficient magnitude to said electrodes to cause a local increase in the temperature of said exposed surface at said defect for a sufficient period of time to remove a portion of said exposed electrode at said defect.

2. The method of claim 1 wherein said etching ambient is a gas.

3. The method of claim 1 wherein said etching ambient is a liquid.

4. The method of claim 1 further comprising the step of cooling said chemical etching ambient below 20° C. prior to immersing said photodetector therein.

5. The method of claim 1 wherein said photodetector comprises a substrate, a first electrode overlying a surface of said substrate, a semiconductor body containing amorphous silicon and having a semiconductor junction therein overlying said first electrode and a second electrode comprising a metallic layer overlying said semiconductor body.

6. The method of claim 1 wherein the local increase in temperature of said electrode at said defect is at least 20° C.

7. The method of claim 6 wherein the reverse-bias voltage applied between said electrodes is at least one volt.

8. The method of claim 7 wherein said reverse-bias voltage applied between said electrodes is less than the breakdown voltage of said photodetector.

9. The method of claim 1 wherein said exposed electrode comprises a metal layer on the surface of the semiconductor body and a passivation layer overlying the metal layer and wherein the portion of the surface of said exposed electrode removed at the defect site is the passivation layer.

10. The method of claim 9 further comprising the step of etching the photodetector to remove the metal layer at the defect site after the passivation layer has been removed.

* * * * *